(12) United States Patent
Kuo et al.

(10) Patent No.: US 12,210,188 B2
(45) Date of Patent: Jan. 28, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Hung-Yi Kuo, Taipei (TW); Chen-Hua Yu, Hsinchu (TW); Cheng-Chieh Hsieh, Tainan (TW); Che-Hsiang Hsu, Taichung (TW); Chung-Ming Weng, Taichung (TW); Tsung-Yuan Yu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 337 days.

(21) Appl. No.: 17/898,427

(22) Filed: Aug. 29, 2022

(65) Prior Publication Data

US 2024/0069277 A1 Feb. 29, 2024

(51) Int. Cl.
*G02B 6/42* (2006.01)
*G02B 6/12* (2006.01)
*G02B 6/34* (2006.01)
*H01L 21/56* (2006.01)
*H01L 25/065* (2023.01)

(52) U.S. Cl.
CPC ........... *G02B 6/12004* (2013.01); *G02B 6/34* (2013.01); *G02B 6/4201* (2013.01); *H01L 21/56* (2013.01); *H01L 25/0652* (2013.01); *G02B 2006/12104* (2013.01); *G02B 2006/12114* (2013.01)

(58) Field of Classification Search
None
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |

(Continued)

*Primary Examiner* — Chad H Smith
(74) *Attorney, Agent, or Firm* — JCIPRNET

(57) ABSTRACT

A semiconductor package includes a first die stack structure and a second die stack structure, an insulating encapsulation, a redistribution structure, at least one prism structure and at least one reflector. The first die stack structure and the second die stack structure are laterally spaced apart from each other along a first direction, and each of the first die stack structure and the second die stack structure comprises an electronic die; and a photonic die electronically communicating with the electronic die. The insulating encapsulation laterally encapsulates the first die stack structure and the second die stack structure. The redistribution structure is disposed on the first die stack structure, the second die stack structure and the insulating encapsulation, and electrically connected to the first die stack structure and the second die stack structure. The at least one prism structure is disposed within the redistribution structure and optically coupled to the photonic die. The at least one reflector is disposed on the at least one prism structure.

20 Claims, 9 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 2021/0271020 A1* | 9/2021 | Islam .................... H01L 25/105 |

* cited by examiner

SEMICONDUCTOR PACKAGE AND MANUFACTURING METHOD THEREOF

BACKGROUND

Currently, semiconductor packages including both photonic dies (known as P-dies) and electronic dies (known as E-dies) are becoming increasingly popular for their compactness. In addition, due to the widely use of optical fiber-related applications for signal transmission, optical signaling and processing have been used in more applications. For example, a prism structure receives light beam from an optical fiber and refracts it to a coupling region in the P-die. Although existing methods of fabricating the semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
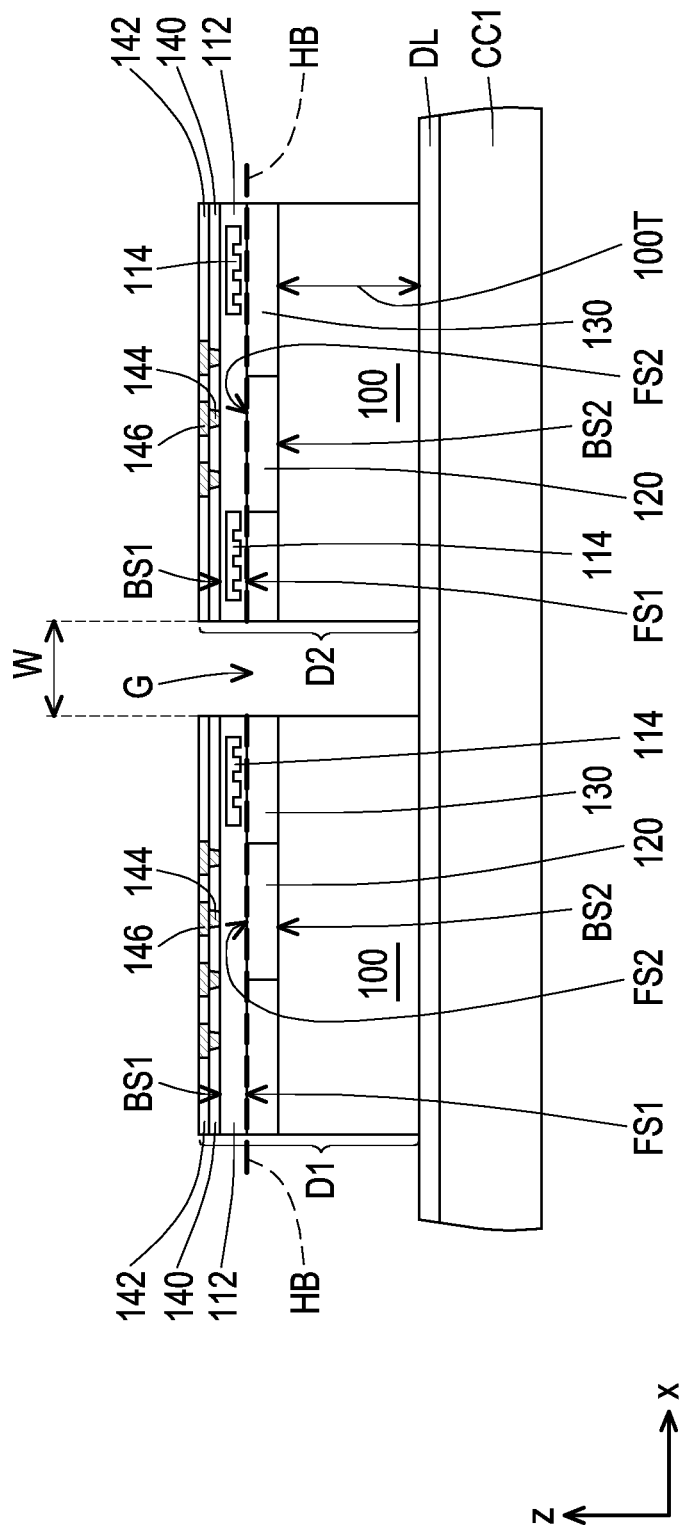
FIGS. 1A-1G are schematic cross-sectional views of intermediate stages in the formation of a semiconductor package, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure are discussed in the context of semiconductor manufacturing, and in particular, in the context of forming a package having a prism structure. Some variations of embodiments are discussed and the intermediate stages of forming the package are illustrated in accordance with some embodiments. It should be appreciated that the illustration throughout the drawings is schematic and not in scale.

FIGS. 1A-1G are schematic cross-sectional views of intermediate stages in the formation of a semiconductor package in accordance with some embodiments of the disclosure. It is understood that the disclosure is not limited by the method described below. Additional operations can be provided before, during, and/or after the method and some of the operations described below can be replaced or eliminated, for additional embodiments of the methods. In exemplary embodiments, the following manufacturing process is part of a wafer level packaging process. In detail, one semiconductor package is shown to represent plural semiconductor packages obtained following the manufacturing process. That is to say, a single package region is illustrated in FIGS. 1A-1G, and the semiconductor package 10 (see FIG. 1G) is formed in the illustrated package region.

Referring to FIG. 1A, a first die stack structure D1 and a second die stack structure D2 are picked and placed on a carrier CC1. In some embodiments, the carrier CC1 includes a glass carrier. However, other material may be adapted as a material of the carrier CC1 as long as the material is able to withstand the subsequent processes while carrying the package structure formed thereon. In some embodiments, the carrier CC1 has a de-bonding layer DL thereon. As shown in FIG. 1A, the de-bonding layer DL is formed on the illustrated top surface of the carrier CC1. In some embodiments, the de-bonding layer DL is an epoxy-based thermal-release material, which loses its adhesive property when heated, such as a light-to-heat-conversion (LTHC) release coating. In other embodiments, the de-bonding layer DL may be an ultra-violet (UV) glue, which loses its adhesive property when exposed to UV lights. However, the disclosure is not limited thereto, and other suitable materials may be adapted for the de-bonding layer DL. In detail, the de-bonding layer DL may allow the structure formed on the carrier CC1 in the subsequent processes to be peeled off from the carrier CC1. The de-bonding layer DL may be dispensed as a liquid and cured, may be a laminate film laminated onto the carrier CC2, or may be the like. The illustrated top surface of the de-bonding layer DL, which is opposite to the illustrated bottom surface contacting the carrier CC1, may be leveled and may have a high degree of planarity, but the disclosure is not limited thereto.

In some embodiments, a buffer layer (not shown) is coated on the de-bonding layer DL, where the de-bonding layer DL is sandwiched between the buffer layer and the carrier CC1, and a top surface of the buffer layer further provides a high degree of coplanarity. The buffer layer may be a dielectric material layer or a polymer layer which is made of polyimide, benzocyclobutene (BCB), polybenzoxazole (PBO), or any other suitable polymer-based dielectric material. In some embodiments, each of the first die stack structure D1 and the second die stack structure D2 is attached to the carrier CC1 through an adhesive layer (not shown). The adhesive layer may include an oxide layer, a die attach tape (DAF) or a suitable adhesive.

In some embodiments, as shown in FIG. 1A, the first die stack structure D1 and the second die stack structure D2 are arranged side by side over the carrier CC1 with a gap G therebetween along a direction X. That is to say, the first die stack structure D1 and the second die stack structure D2 are laterally spaced apart from each other via the gap G. In some embodiments, the width W of the gap G along the direction X is no more than about 10000 µm. For example, the width W of the gap G ranges from about 20 µm to 80 µm. In other words, the first die stack structure D1 and the second die stack structure D2 are spaced apart with the width W of the gap G along the direction X. Other value or range of the width W of the gap G may be applicable upon the process requirements.

Each of the first die stack structure D1 and the second die stack structure D2 includes a supporting substrate 100, a photonic die 110, an electronic die 120, an insulating encapsulation 130, a dielectric layer 140, a dielectric layer 142, a plurality of conductive vias 144, and a plurality of conductive patterns 146. In some embodiments, each of the first die stack structure D1 and the second die stack structure D2 is fabricated in a wafer form, in a package form, or the like. In some embodiments, the supporting substrate 100 is a bulk silicon substrate having the thickness 100T. In some embodiments, the thickness 100T of the supporting substrate 100 ranges from about 100 µm to 400 µm.

As shown in FIG. 1A, the size of the photonic die 110 may be greater than the size of the electronic die 120. For example, the footprint area occupied by the photonic die 110 is greater than the footprint area occupied by the electronic die 120. The footprint area occupied by the electronic die 120 may fully overlap the footprint area occupied by the photonic die 110. Alternatively, the electronic die 120 is staggered with and partially overlaps the photonic die 110. Although one photonic die 110 and one electronic die 120 are illustrated in FIG. 1A, a plurality of photonic dies arranged as an array and a plurality of electronic dies stacked upon the array of the photonic dies may be possible in accordance with some embodiments. The photonic die 110 may be responsible for the Input-Output (I/O) of the optical signals. For example, the photonic die 110 has the function of receiving optical signals, transmitting the optical signals inside the photonic die 110, transmitting the optical signals out of the photonic die 110, and electronically communicating with the electronic die 120.

In some embodiments, the photonic die 110 includes a substrate 112 that may be a semiconductor substrate (e.g., a silicon substrate, a silicon germanium substrate, etc.), a dielectric substrate, or a substrate formed of other semiconductor materials. The photonic die 110 may include photonic integrated circuits formed in/on the substrate 112 to process, receive, and/or transmit optical signals. The light-to-electrical conversion devices (e.g., photo-diodes) and/or electrical-to-light conversion devices (e.g., light emitting didoes, lamps, or the like) may be built inside the photonic die 110 or external to and attached to the photonic die 110. In some embodiments, the photonic die 210 is a photonic integrated circuit (PIC) die. The photonic die 110 may include at least one coupling region (e.g., an optical component 114) over the substrate 112. It is noted that the optical component 114 is illustrated as formed in the substrate 112 in FIG. 1A, but it should be understood that the optical component 114 is formed over the substrate 112.

In some embodiments, as shown in FIG. 1A, the optical component 114 is a grating coupler having grating. Any numbers of gratings in the grating coupler may be used. The grating coupler may include one or more reflective and/or conductive materials or any other suitable material. The grating coupler has the function of receiving light or transmitting light. For example, the grating coupler used for receiving light receives the light from the optical signal source 500 (as show in FIG. 1G) and transmits the light to photodetector (not shown) within the photonic die 110 (such as the optical path OP2 shown in FIG. 1G), and the grating coupler used for transmitting light receives the light from photodetector (not shown) and transmits the light to optical signal source 500 or another grating coupler (such as the optical paths OP1, OP3 and OP4 shown in FIG. 1G). In some embodiments, the grating coupler is designed in inverse design. In detail, as shown in FIG. 1A, the light enters into or exits out the photonic die 110 from the backside BS2 of the photonic die 110. However, the disclosure is not limited thereto. In some alternative embodiments, the optical component 114 may include a grating coupler; or may be or may include an I/O coupler, an edge coupler, a laser, an optical modulator, a detector, a waveguide, a splitter, a converter, a switch, etc. In some embodiments, integrated electronic devices (e.g., transistors, diodes, capacitors, resistors, metal routing, and the like) may also be formed within the photonic die 110, and may be coupled to the optical component 114 within the photonic die 110.

In some embodiments, the electronic die 120 includes electronic integrated circuits for processing the electrical signals converted from the optical signals in the photonic die 110. In some embodiments, the electronic die 120 exchanges electrical signals with the photonic die 110. The electronic die 120 may be or may include an application-specific IC (ASIC) die, a logic IC die, a memory die, an analog IC die, and/or the like. In some embodiments, the electronic die 120 is an electronic integrated circuit (EIC) die. In some embodiments, the electronic die 120 is a package structure of which a plurality of die components is encapsulated in a packaging encapsulation (not shown).

In some embodiments, the electronic die 120 is stacked upon and bonded to the photonic die 110. As shown in FIG. 1A, the front side FS2 of the electronic die 120 is bended to and in contact with the front side FS1 of the photonic die 110, and the backside BS2 of the electronic die 120 is in contact with the supporting substrate 100. In some embodiments, the electronic die 120 is hybrid-bonded with the photonic die 110. That is to say, the electronic die 120 is bonded with the photonic die 110 through the metal-to-metal bonding and the dielectric-to-dielectric bonding. As such, a hybrid bonding interface HB (represented by the dash line in FIG. 1A) is located between the electronic die 120 and the photonic die 110. Further, since the front side FS2 of the electronic die 120 is bonded to and in contact with the front side FS1 of the photonic die 110, a face-to-face hybrid bonding process is performed to bond the electronic die 120 with the photonic die 110. However, the disclosure is not limited thereto. In some alternative embodiments, the bonding of the electronic die 120 and the photonic die 110 may be achieved through solder bonding, direct metal-to-metal bonding, etc. By using suitable bonding manner, optimal integration including high-speed and low power operation may be achieved. In some embodiments, the electronic die 120 is in electrical communication with the photonic die 110 through connections including a redistribution structure, a plurality of through substrate vias or through interlayer vias, and/or the like. It is appreciated that photonic die 110 and the electronic die 120 may include various other devices and circuits that may be used for processing and transmitting optical and electrical signals, which are also contemplated in accordance with some embodiments.

In some embodiments, as shown in FIG. 1A, the insulating encapsulation 130 is formed and disposed to at least laterally cover and encapsulate the electronic die 120. The insulating encapsulation 130 may be or may include a dielectric material, a polymer material, a underfill material, a combination thereof, and/or other suitable protective material(s). Alternatively, the insulating encapsulation 130 may be omitted.

In some embodiments, as shown in FIG. 1A, the dielectric layer 140 is formed and disposed on the backside BS1 of the photonic die 110, and the dielectric layer 142 is formed and disposed on the dielectric layer 140. The material of the dielectric layer 140 may be or may include SiOX, SiN or any other suitable dielectric material. The dielectric layer 140 may be formed by spin-on coating, chemical vapor deposition (CVD), plasma-enhanced chemical vapor deposition (PECVD), or the like. The material of the dielectric layer 142 may be or may include SiOX, SiN, polymer, or any other suitable dielectric material. The dielectric layer 142 may be formed by spin-on coating, CVD, PECVD, or the like.

In some embodiments, as shown in FIG. 1A, the plurality of conductive vias 144 are formed and disposed in the dielectric layer 140. In some embodiments, the formation of the conductive vias 144 includes first forming a plurality of openings (not shown) in the passivation layer 112, and forming the conductive vias 144 in the said openings. The conductive vias 144 may be formed by, for example, electroplating, deposition, and/or photolithography and etching. The material of the conductive vias 144 may be or may include aluminum, titanium, copper, nickel, tungsten, or alloys thereof.

In some embodiments, as shown in FIG. 1A, the plurality of conductive patterns 146 are formed and disposed in the dielectric layer 142. From another point of view, each of the conductive patterns 146 is formed and disposed on the corresponding conductive via 144. In some embodiments, each conductive pattern 146 and the corresponding conductive via 144 are collectively referred to as an electrical connector which connects the first die stack structure D1 or the second die stack structure D2 with the redistribution structure 300 (as show in FIG. 1F). The conductive patterns 146 may be formed by, for example, electroplating, deposition, and/or photolithography and etching. In some embodiments, the conductive patterns 146 and the conductive vias 144 are formed integrally by a dual damascene process. In some alternative embodiments, the conductive patterns 146 and the conductive vias 144 are formed separately by a single damascene process or any other suitable process. The number of the conductive vias 144 and the number of the conductive patterns 146 in each of the first die stack structure D1 and the second die stack structure D2 are not limited in the disclosure, and may be more than or less than what is depicted in FIG. 1A, and may be designated based on demand and/or design layout.

Figure 1B:
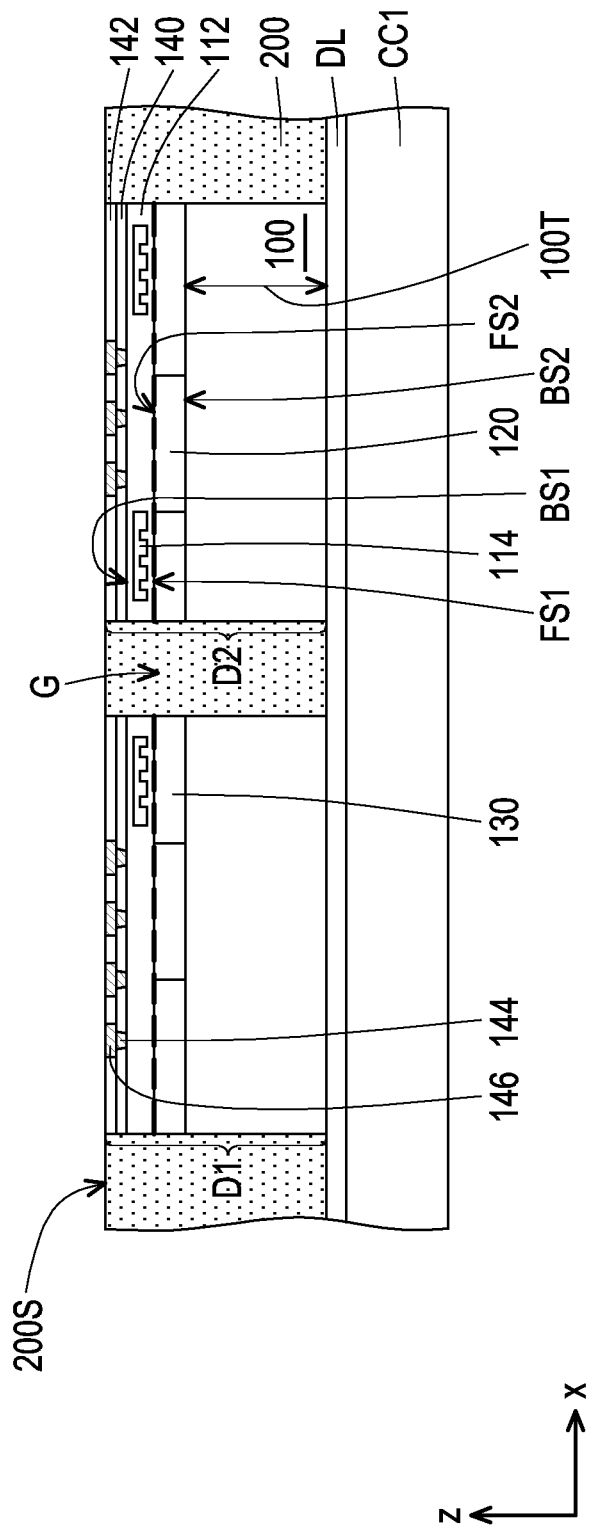

Referring to FIG. 1B, an insulating encapsulation 200 is formed over the carrier CC1 to laterally encapsulate the first die stack structure D1 and the second die stack structure D2. As shown in FIG. 1B, the insulating encapsulation 200 is formed to fill the gap G between the first die stack structure D1 and the second die stack structure D2 and wrap around the sidewalls of the first die stack structure D1 and the second die stack structure D2. In some embodiments, the insulating encapsulation 200 may be referred to as "gap-fill material".

In some embodiments, the method of forming the insulating encapsulation 200 may include the following steps: forming an encapsulant material on the carrier CC1 by an over-molding process or a film deposition process; and then performing a planarization process to expose the illustrated top surfaces of the first die stack structure D1 and the second die stack structure D2. In some embodiments, the over-molding process is a compression molding process, for example. In some embodiments, the film deposition process may include CVD, High-Density Plasma Chemical Vapor Deposition (HDPCVD), PECVD, atomic layer deposition (ALD), or combinations thereof. In some embodiments, the planarization process may include a mechanical grinding process, a CMP process, or combinations thereof. In some embodiments, the insulating encapsulation 200 may include a molding compound, a molding underfill, a resin (such as epoxy resin), or the like. In some alternative embodiments, the insulating encapsulation 200 may include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the insulating encapsulation 200 may include a base material (e.g., a polymer, a resin or the like) and filler particles (e.g., silica, clay or the like) distributed in the base material. In some embodiments, as shown FIG. 1B, the surface 200S of the insulating encapsulation 200 is substantially leveled with the illustrated top surfaces of the first die stack structure D1 and the second die stack structure D2.

Following the formation of the insulating encapsulation 200, a redistribution structure 300, a prism structure 400A and a prism structure 400B are formed over the insulating encapsulation 200, the first die stack structure D1 and the second die stack structure D2 along a direction Z perpendicular to the direction X. The configuration of the redistribution structure 300, the prism structure 400A and the prism structure 400B plays significant roles in ensuring the intercommunication of the optical signals between the first die stack structure D1 and the second die stack structure D2, and the intercommunication of the optical signals between the second die stack structure D2 and the optical signal source 500. The configuration and the manufacturing process of the redistribution structure 300, the prism structure 400A and the prism structure 400B will be described in detail below in conjunction with FIG. 1C to FIG. 1F.

Figure 1C:
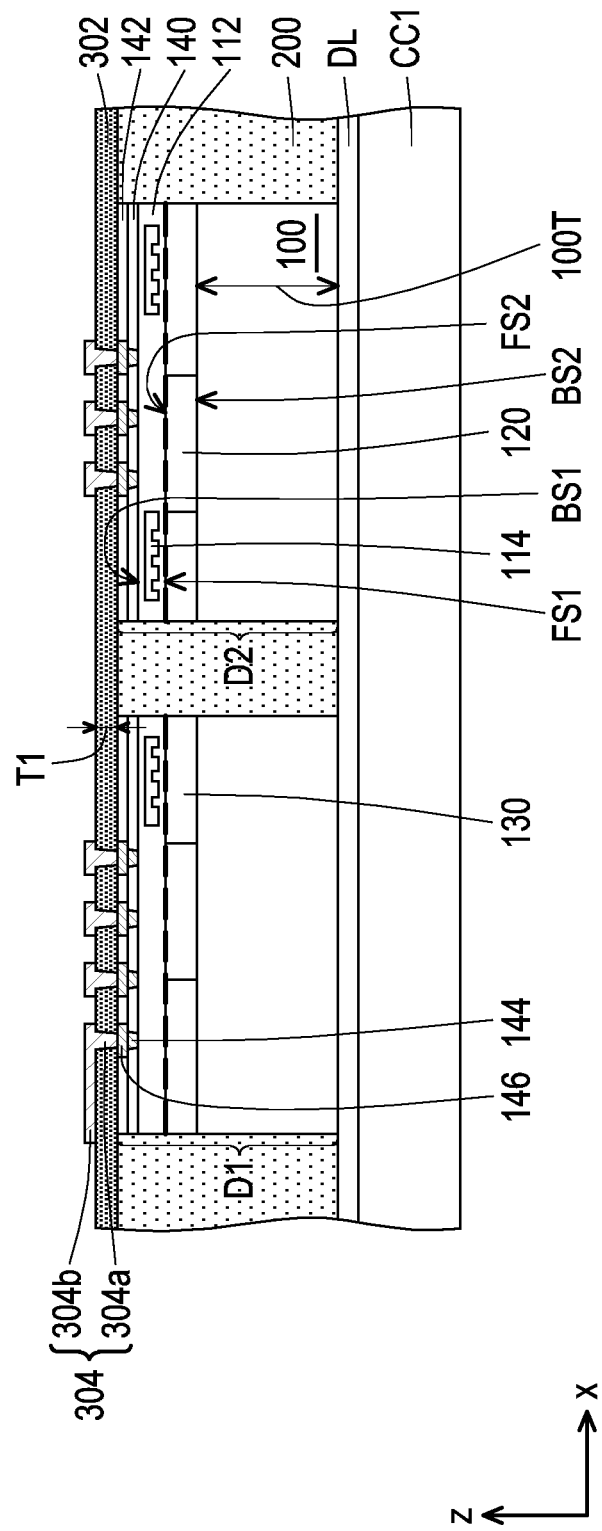

Referring to FIG. 1C, an optical dielectric layer 302 and a redistribution layer 304 are formed over the insulating encapsulation 200, the first die stack structure D1 and the second die stack structure D2. In detail, as shown in FIG. 1C, the redistribution layer 304 protrudes from the illustrated top surface of the optical dielectric layer 302, that is, the illustrated top surface of the redistribution layer 304 is higher than the illustrated top surface of the optical dielectric layer 302. Further, as shown in FIG. 1C, the illustrated bottom surface of the redistribution layer 304 and the illustrated bottom surface of the bottommost layer of the optical dielectric layer 302 are substantially level with each other, and are in contact with the insulating encapsulation 200, the first die stack structure D1 and/or the second die stack structure D2.

Figure 1D:
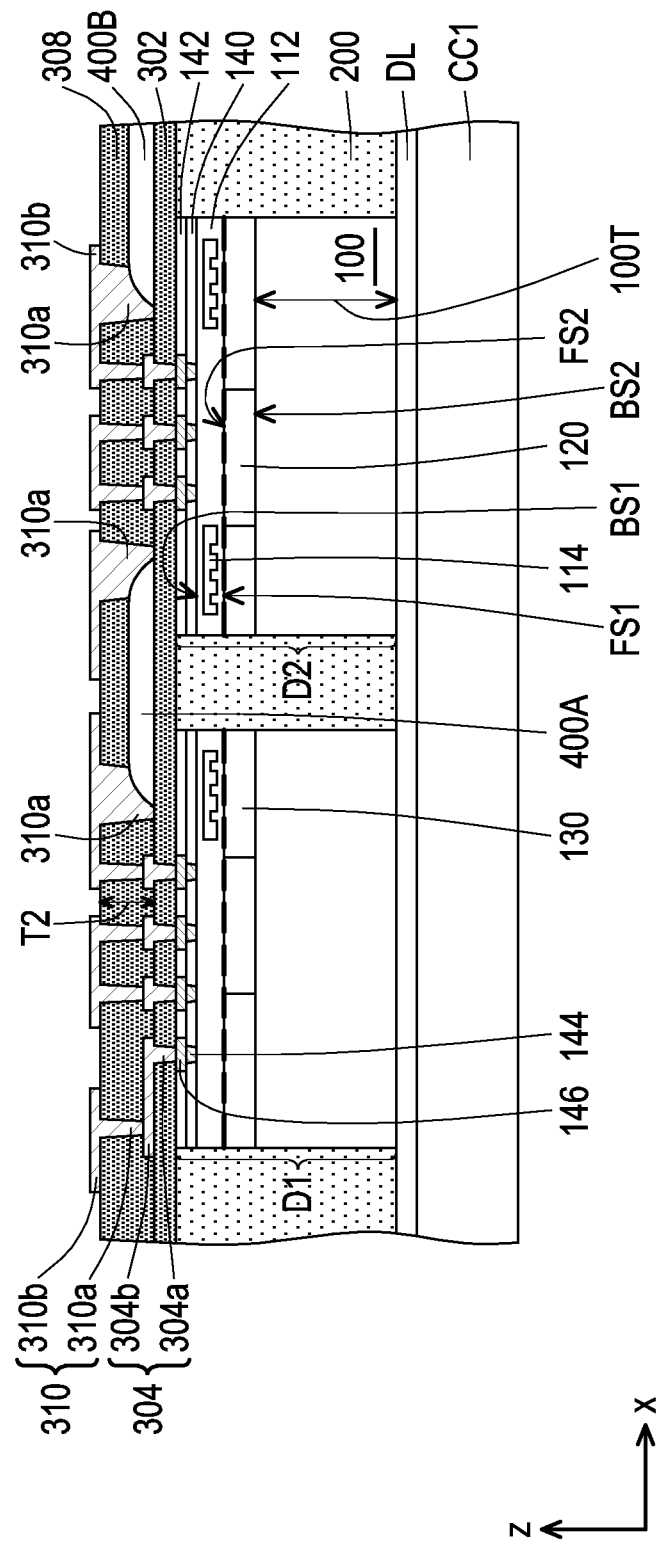

The optical signal (e.g., light emitted from the optical signal source 500) is allowed to pass through the optical dielectric layer 302. In some embodiments, the material of the optical dielectric layer 302 includes polymer, such as epoxy, or acrylic. In some embodiments, the optical dielectric layer 302 is formed by spin-coating, physical vapor deposition (PVD), CVD, ALD, or any suitable deposition process. The optical dielectric layer 302 is index-matched to the prism structure 400A and the prism structure 400B (as shown in FIG. 1D) to reduce optical loss. In detail, the refractive index of the optical dielectric layer 302 may be selected according to the refractive indices of the prism structure 400A and the prism structure 400B. In some embodiments, the refractive index of the optical dielectric layer 302 is in a range of about 1.4 to about 1.6. In some embodiments, the thickness T1 of the optical dielectric layer 302 is in the range from about 2 μm to about 10 μm.

In some embodiments, the material of the redistribution layer 304 includes a conductive material such as copper, copper alloy, aluminum, aluminum alloy, or combinations thereof. In certain embodiments, the redistribution layer 304 is a copper layer. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. In some embodiments, the redistribution layer 304 is formed by electroplating, deposition, and/or photolithography and etching. In the case that the redistribution layer 304 is formed by electroplating, the redistribution layer 304 may include a seed layer (not shown) under the plated conductive material, wherein the seed layer and the plated conductive material may be formed of the same material or different materials.

In some embodiments, the redistribution layer 304 includes a conductive wiring layer 304b and one or more conductive vias 304a. In some embodiments, as shown in FIG. 1C, the conductive wiring layer 304b is stacked on the optical dielectric layer 302 along the direction Z, and the conductive wiring layer 304b extends horizontally on the illustrated top surface of the optical dielectric layer 302 along the direction X. In some embodiments, the conductive wiring layer 304b may include conductive traces (conductive lines), conductive pads or a combination thereof. In some embodiments, as shown in FIG. 1C, the conductive vias 304a are embedded in the optical dielectric layer 302, and each of the conductive vias 304a extends vertically through the optical dielectric layer 302 along the direction Z to establish electrical connection between the conductive wiring layer 304b and the electrical connectors of the first die stack structure D1 and the second die stack structure D2.

In some embodiments, as shown in FIG. 1C, the cross-sectional shape of the conductive via 304a is inverted trapezoid. That is to say, the lateral dimension of the conductive via 304a decreases from the top of the conductive via 304a to the bottom of the conductive via 304a along the direction Z. In other words, as shown in FIG. 1C, the conductive via 304a is tapered toward the first die stack structure D1 or the second die stack structure D2 along the direction Z. However, the disclosure is not limited thereto. In some alternative embodiments, the conductive via 304a may have substantially vertical sidewalls along the direction Z. The number of the conductive vias 304a in the optical dielectric layer 302 is not limited in the disclosure, and may be more than or less than what is depicted in FIG. 1C, and may be designated based on demand and/or design layout.

Referring to FIG. 1D, a prism structure 400A and a prism structure 400B are formed on the optical dielectric layer 302. As shown in FIG. 1D, the prism structure 400A is overlapped with the first die stack structure D1 and the second die stack structure D2, and the prism structure 400B is overlapped with the second die stack structure D2. In detail, the curved surfaces of the prism structure 400A are, respectively, overlapped with the optical component 114 in the first die stack structure D1 and the optical component 114 in the second die stack structure D2, and the curved surface of the prism structure 400B is overlapped with another optical component 114 in the second die stack structure D2. As such, the prism structure 400A can transmit the optical signals between the first die stack structure D1 and the second die stack structure D2, and the prism structure 400B can transmit the optical signals between the second die stack structure D2 and the optical signal source 500. In some embodiments, a vertical projection of the prism structure 400A onto the carrier CC1 in the direction Z is partially overlapped with a vertical projection of the optical component 114 in the first die stack structure D1 onto the carrier CC1 in the direction Z and partially overlapped with a vertical projection of the optical component 114 in the second die stack structure D2 onto the carrier CC1 in the direction Z, and a vertical projection of the prism structure 400B onto the carrier CC1 in the direction Z is partially overlapped with a vertical projection of the optical component 114 in the second die stack structure D2 onto the carrier CC1 in the direction Z. From another point of view, the prism structure 400A extends over the first die stack structure D1 and the second die stack structure D2, and the prism structure 400B extends over the second die stack structure D2. In some embodiments, each of the prism structure 400A and the prism structure 400B is formed by using gray-scale masking and lithography. That is to say, a gray-scale mask that is provided by creating layers of varying light passing characteristics on the surface of the mask is used to form the prism structure 400A and the prism structure 400B. In detail, by varying the thickness of the layers on the surface of the gray-scale mask, the light density that is allowed to pass through the gray-scale mask may be made to vary, and thus portions of each of the prism structure 400A and the prism structure 400B are exposed to a gradient depth and the curved profile of each of the prism structure 400A and the prism structure 400B is formed. Alternatively, any suitable lithographic mask (e.g., a binary mask or a phase-shift mask) may be employed as long as the mask provides grade light passing capabilities from transparent to opaque and any intermediate degree of light blocking for parts of a pattern on the surface of the lithographic mask. And, it is appreciated that the curvature radii of the curved profile of each of the prism structure 400A and the prism structure 400B in the cross section may be controlled by modifying process parameters of gray-scale lithography. In some embodiments, as shown in FIG. 1D, the curved profile of the prism structure 400A has two curved surfaces, and the curved profile of the prism structure 400B has one curved surface. In some embodiments, the curved surface of each of the prism structure 400A and the prism structure 400B is a concave surface. In detail, as shown in FIG. 1D, the concave surface of each of the prism structure 400A and the prism structure 400B face downwardly toward the first die stack structure D1 or the second die stack structure D2.

Continued on FIG. 1D, an optical dielectric layer 308 and a redistribution layer 310 are formed on the optical dielectric layer 302, the redistribution layer 304, the prism structure 400A and the prism structure 400B. In detail, as shown in FIG. 1D, the redistribution layer 310 protrudes from the illustrated top surface of the optical dielectric layer 308, that is, the illustrated top surface of the redistribution layer 310 is higher than the illustrated top surface of the optical dielectric layer 308.

The optical signal (e.g., light transmitted by the optical component 114) is allowed to pass through the optical dielectric layer 308. In some embodiments, the material of the optical dielectric layer 308 includes polymer, such as epoxy, or acrylic. In some embodiments, the material of the optical dielectric layer 308 is the same as the material of the optical dielectric layer 302. In some alternative embodiments, the material of the optical dielectric layer 308 is different from the material of the optical dielectric layer 302. In some embodiments, the optical dielectric layer 308 is formed by spin-coating, PVD, CVD, ALD, or any suitable deposition process. The optical dielectric layer 308 is index-matched to the prism structure 400A and the prism structure 400B to reduce optical loss. In detail, the refractive index of the optical dielectric layer 308 may be selected according to the refractive indices of the prism structure 400A and the prism structure 400B. In some embodiments, the refractive index of the optical dielectric layer 308 is in a range of about 1.4 to about 1.6. In some embodiments, the thickness T2 of the optical dielectric layer 308 is in the range from about 5 μm to about 60 μm.

In some embodiments, the material of the redistribution layer 310 includes a conductive material such as copper, copper alloy, aluminum, aluminum alloy, or combinations thereof. In certain embodiments, the redistribution layer 310 is a copper layer. In some embodiments, the redistribution layer 310 is formed by electroplating, deposition, and/or photolithography and etching. In the case that the redistribution layer 310 is formed by electroplating, the redistribution layer 310 may include a seed layer (not shown) under the plated conductive material, wherein the seed layer and the plated conductive material may be formed of the same material or different materials.

In some embodiments, the redistribution layer 310 includes a conductive wiring layer 310b and one or more conductive vias 310a. In some embodiments, as shown in FIG. 1D, the conductive wiring layer 310b is stacked on the optical dielectric layer 308 along the direction Z, and the conductive wiring layer 310b extends horizontally on the illustrated top surface of the optical dielectric layer 308 along the direction X. In some embodiments, the conductive wiring layer 310b may include conductive traces (conductive lines), conductive pads or a combination thereof.

In some embodiments, as shown in FIG. 1D, the conductive vias 310a are embedded in the optical dielectric layer 308, and each of the conductive vias 310a extends vertically through the optical dielectric layer 308 along the direction Z. In some embodiments, as shown in FIG. 1D, some of the conductive vias 310a extend vertically through the optical dielectric layer 308 to establish electrical connection between the conductive wiring layer 304b and the conductive wiring layer 310b. In detail, as shown in FIG. 1D, the some of the conductive vias 310a establishing the electrical connection between the conductive wiring layer 304b and the conductive wiring layer 310b are in physical and direct contact with the conductive wiring layer 304b. In some embodiments, as shown in FIG. 1D, some of the conductive vias 310a extend vertically through the optical dielectric layer 308 to be in physical and direct contact with the prism structure 400A or the prism structure 400B. In detail, as shown in FIG. 1D, the some of the conductive vias 310a being in physical and direct contact with the prism structure 400A or the prism structure 400B are in physical and direct contact with the curved profile of each of the prism structure 400A and the prism structure 400B. In some embodiments, the some of the conductive vias 310a being in physical and direct contact with the prism structure 400A or the prism structure 400B are referred to as "reflectors". For example, in the optical path OP2 (as show in FIG. 1G), light emitted from the optical signal source 500 enters from the incidence surface of the prism structure 400B and then is reflected by the conductive via 310a being in physical and direct contact with the prism structure 400B to travel toward the optical component 114 in the second die stack structure D2. From another point of view, the optical signal source 500 is optically coupled to the second die stack structure D2 through the prism structure 400B and the conductive via 310a being in physical and direct contact with the prism structure 400B (i.e., reflector).

In some embodiments, as shown in FIG. 1D, the cross-sectional shape of the conductive via 310a is inverted trapezoid. That is to say, the lateral dimension of the conductive via 310a decreases from the top of the conductive via 310a to the bottom of the conductive via 310a along the direction Z. In other words, as shown in FIG. 1D, the conductive via 310a is tapered toward the first die stack structure D1 or the second die stack structure D2 along the direction Z. However, the disclosure is not limited thereto. In some alternative embodiments, the conductive via 310a may have substantially vertical sidewalls along the direction Z. The number of the conductive vias 310a in the optical dielectric layer 308 is not limited in the disclosure, and may be more than or less than what is depicted in FIG. 1D, and may be designated based on demand and/or design layout.

Figure 1E:
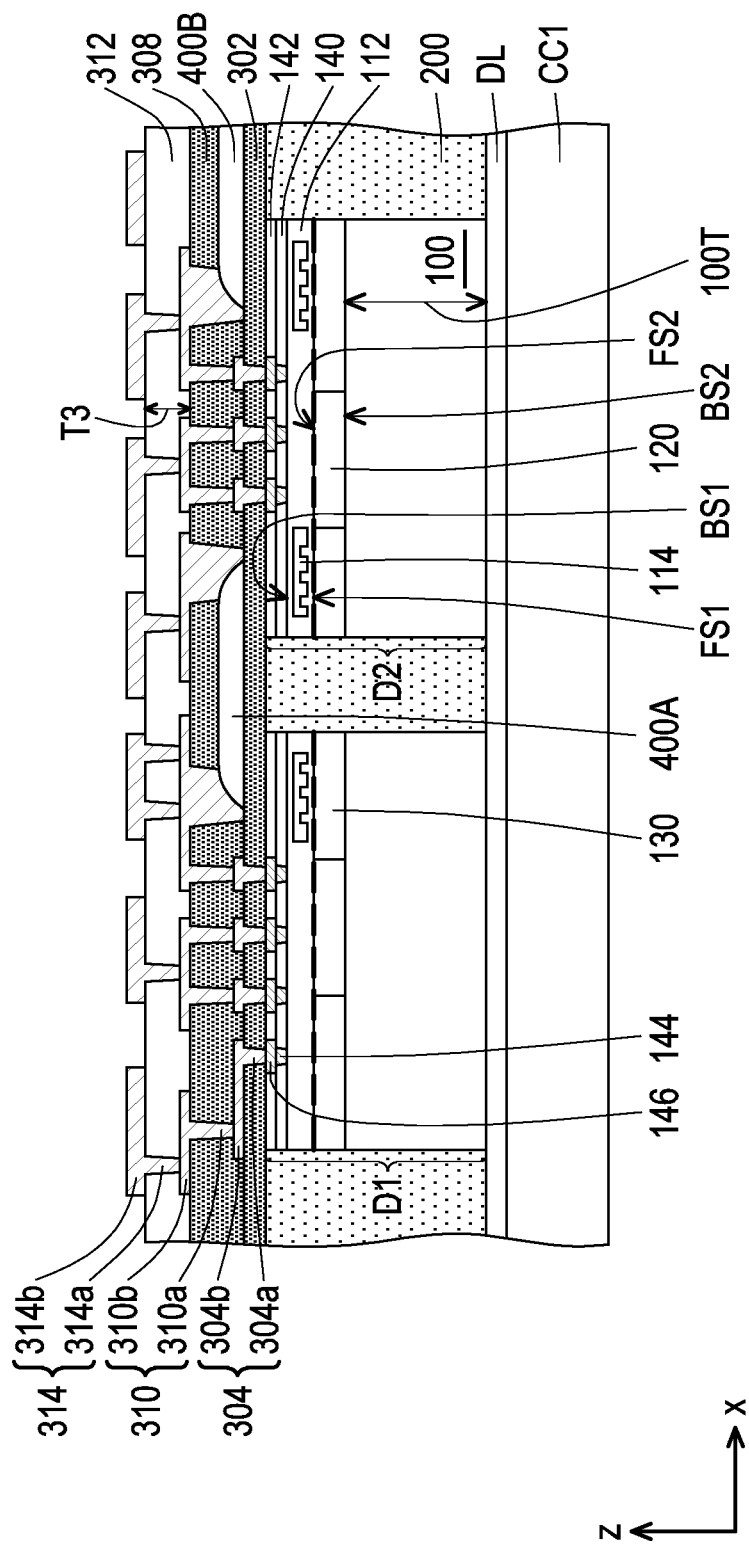

Referring to FIG. 1E, a dielectric layer 312 and a redistribution layer 314 are formed over the optical dielectric layer 308 and the redistribution layer 310. In detail, as shown in FIG. 1E, the redistribution layer 314 protrudes from the illustrated top surface of the dielectric layer 312, that is, the illustrated top surface of the redistribution layer 314 is higher than the illustrated top surface of the dielectric layer 312. As shown in FIG. 1E, one dielectric layer 312 and one redistribution layer 314 are formed over the carrier CC1 as an example. However, the disclosure is not limited thereto, more than one dielectric layer 312 and more than one redistribution layer 314 may be formed.

In some embodiments, the material of the dielectric layer 312 includes polymer, such as PI, BCB, or PBO. In some alternative embodiments, the material of the dielectric layer 312 includes non-organic dielectric materials, such as silicon oxide ($SiO_x$, where x>0), silicon nitride ($SiN_x$, where x>0), silicon carbide, silicon oxynitride ($SiO_x N_y$, where x>0 and y>0), phosphosilicate glass (PSG), borosilicate glass (BSG), or boron-doped phosphosilicate glass (BPSG). In some embodiments, the dielectric layer 312 is formed by suitable fabrication techniques such as spin-on coating, CVD, HDPCVD, PECVD, or ALD. In some embodiments, the thickness T3 of the dielectric layer 312 is in the range from about 5 μm to about 10 μm.

In some embodiments, the material of the redistribution layer 314 includes a conductive material such as copper, copper alloy, aluminum, aluminum alloy, or combinations thereof. In certain embodiments, the redistribution layer 314 is a copper layer. In some embodiments, the redistribution layer 314 is formed by electroplating, deposition, and/or photolithography and etching. In the case that the redistribution layer 314 is formed by electroplating, the redistribution layer 314 may include a seed layer (not shown) under the plated conductive material, wherein the seed layer and the plated conductive material may be formed of the same material or different materials.

In some embodiments, the redistribution layer 314 includes a conductive wiring layer 314b and one or more conductive vias 314a. In some embodiments, as shown in FIG. 1E, the conductive wiring layer 314b is stacked on the dielectric layer 312 along the direction Z, and the conductive wiring layer 314b extends horizontally on the illustrated top surface of the dielectric layer 312 along the direction X. In some embodiments, the conductive wiring layer 314b may include conductive traces (conductive lines), conductive pads or a combination thereof. In some embodiments, as shown in FIG. 1E, the conductive vias 314a are embedded in the dielectric layer 312, and each of the conductive vias 314a extends vertically through the dielectric layer 312 along the direction Z to establish electrical connection between the conductive wiring layer 314b and the conductive wiring layer 310b.

In some embodiments, as shown in FIG. 1E, the cross-sectional shape of the conductive via 314a is inverted trapezoid. That is to say, the lateral dimension of the conductive via 314a decreases from the top of the conductive via 314a to the bottom of the conductive via 314a along the direction Z. In other words, as shown in FIG. 1E, the conductive via 314a is tapered toward the first die stack structure D1 or the second die stack structure D2 along the direction Z. However, the disclosure is not limited thereto. In some alternative embodiments, the conductive via 314a may have substantially vertical sidewalls along the direction Z. The number of the conductive vias 314a in the dielectric layer 312 is not limited in the disclosure, and may be more than or less than what is depicted in FIG. 1E, and may be designated based on demand and/or design layout.

In some embodiments, the redistribution layer 304, the redistribution layer 310 and the redistribution layer 314 are fine-featured redistribution layer. For example, the conductive patterns (such as conductive traces (conductive lines), conductive pads or a combination thereof) of each of the conductive wiring layer 304b, conductive wiring layer 310b and conductive wiring layer 314b are formed with fine dimension (such as length, width, height and thickness) and pitch.

Figure 1F:
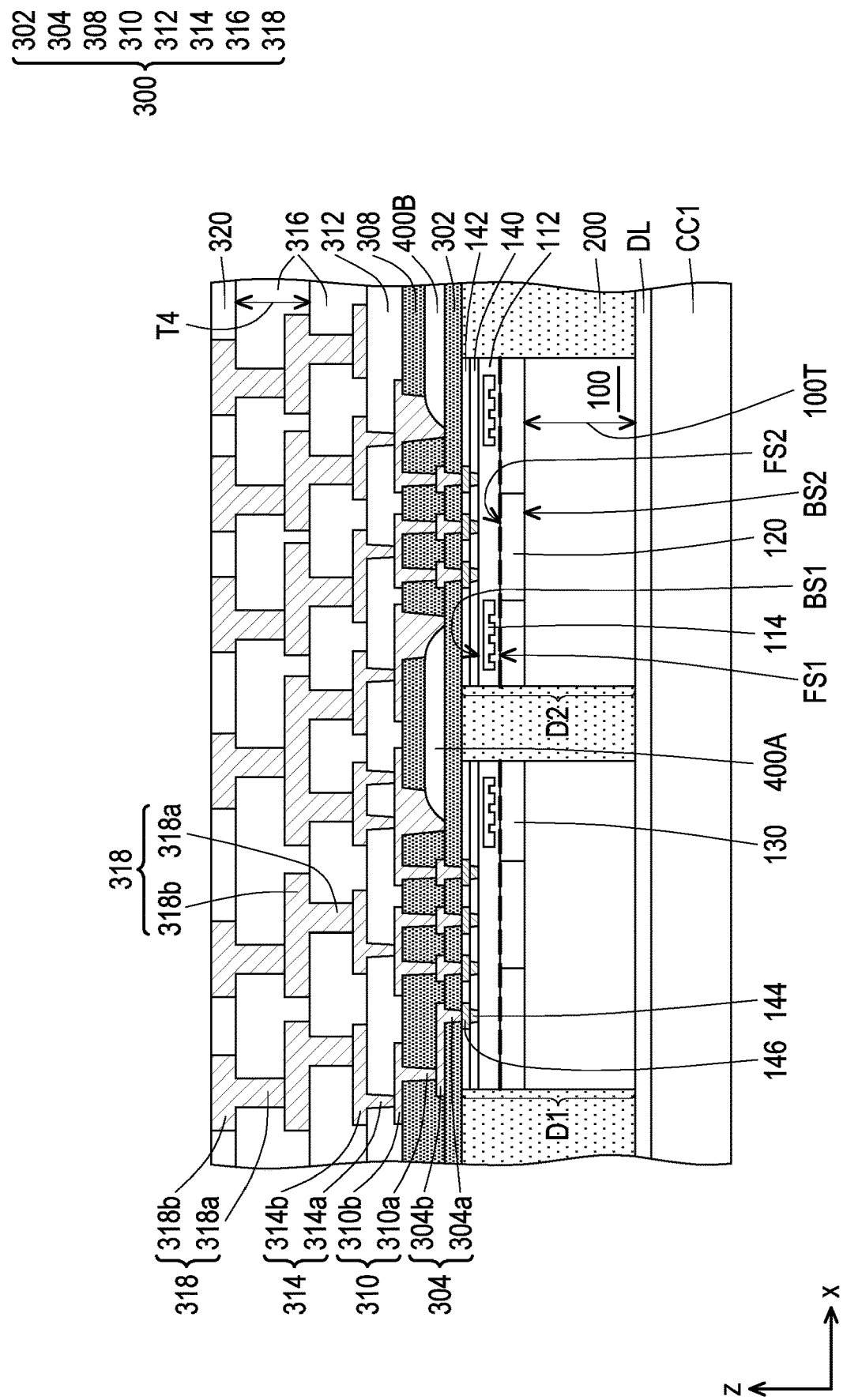

Referring to FIG. 1F, a plurality of dielectric layers 316 and a plurality of redistribution layers 318 are formed and stacked alternately along the direction Z over the dielectric layer 312 and the redistribution layer 314. In certain embodiments, as shown in FIG. 1F, the redistribution layers 318 are sandwiched between the dielectric layers 316, where portions of the topmost layer of the redistribution layers 318 are located on the topmost layer of the dielectric layers 316 for being connected with one or more overlying connectors (e.g., later-formed conductive connector(s) or device(s) such as voltage regulator module(s), semiconductor die(s) or passive device(s)), and the bottommost layer of the redistribution layers 318 is exposed by the bottommost layer of the dielectric layers 316 for being connected with the redistribution layer 314. Moreover, as shown in FIG. 1F, the redistribution layer 318 protrudes from the illustrated top surface of the corresponding dielectric layer 316, that is, the illustrated top surface of the redistribution layer 318 is higher than the illustrated top surface of the corresponding dielectric layer 316. As shown in FIG. 1F, two dielectric layers 316 and two redistribution layers 318 are formed over the carrier CC1 as an example. However, the disclosure is not limited thereto, less than or more than two dielectric layers 316 and less than or more than two redistribution layers 318 may be formed.

In some embodiments, the material of the dielectric layer 316 includes polymer, such as PI, BCB, or PBO. In some alternative embodiments, the material of the dielectric layer 316 includes non-organic dielectric materials, such as silicon oxide ($SiO_x$, where x>0), silicon nitride ($SiN_x$, where x>0), silicon carbide, silicon oxynitride ($SiO_xN_y$, where x>0 and y>0), PSG, BSG, or BPSG. In some embodiments, the dielectric layer 316 is formed by suitable fabrication techniques such as spin-on coating, CVD, HDPCVD, PECVD, or ALD. In some embodiments, the thickness T4 of the dielectric layer 316 is in the range from about 10 μm to about 40 μm.

In some embodiments, the material of the redistribution layer 318 includes a conductive material such as copper, copper alloy, aluminum, aluminum alloy, or combinations thereof. In certain embodiments, the redistribution layer 318 is a copper layer. In some embodiments, the redistribution layer 318 is formed by electroplating, deposition, and/or photolithography and etching. In the case that the redistribution layer 318 is formed by electroplating, the redistribution layer 318 may include a seed layer (not shown) under the plated conductive material, wherein the seed layer and the plated conductive material may be formed of the same material or different materials.

In some embodiments, the redistribution layer 318 includes a conductive wiring layer 318b and one or more conductive vias 318a. In some embodiments, as shown in FIG. 1F, the conductive wiring layer 318b is stacked on the dielectric layer 316 along the direction Z, and the conductive wiring layer 318b extends horizontally on the illustrated top surface of the dielectric layer 316 along the direction X. In some embodiments, the conductive wiring layer 318b may include conductive traces (conductive lines), conductive pads or a combination thereof. In some embodiments, as shown in FIG. 1F, the conductive vias 318a are embedded in the dielectric layer 316, and each of the conductive vias 318a extends vertically through the dielectric layer 316 along the direction Z.

In some embodiments, as shown in FIG. 1F, the conductive via 318a has substantially vertical sidewalls along the direction Z. However, the disclosure is not limited thereto. In some alternative embodiments, the cross-sectional shape of the conductive via 318a is inverted trapezoid. That is to say, the lateral dimension of the conductive via 318a decreases from the top of the conductive via 318a to the bottom of the conductive via 318a along the direction Z. The number of the conductive vias 318a in the dielectric layer 316 is not limited in the disclosure, and may be more than or less than what is depicted in FIG. 1F, and may be designated based on demand and/or design layout.

In some embodiments, the redistribution layer 318 is coarse-featured redistribution layer. For example, the conductive patterns (such as conductive traces (conductive lines), conductive pads or a combination thereof) of the conductive wiring layer 318b are formed with coarse dimension (such as length, width, height and thickness) and pitch. In some embodiments, the dimensions and pitches of the conductive vias 318a and the conductive patterns of the conductive wiring layer 318b in the redistribution layer 318 (i.e., coarse-featured redistribution layer) are greater than the dimensions and pitches of the conductive vias 304a and the conductive patterns of the conductive wiring layer 304b in the redistribution layer 304 (i.e., fine-featured redistribution layer), the conductive vias 310a and the conductive patterns of the conductive wiring layer 310b in the redistribution layer 310 (i.e., fine-featured redistribution layer), and the conductive vias 314a and the conductive patterns of the conductive wiring layer 314b in the redistribution layer 314 (i.e., fine-featured redistribution layer). For example, the sizes of lines and spaces (L/S) of the redistribution layer 318 are greater than the sizes of L/S of the redistribution layer 304, the redistribution layer 310 and the redistribution layer 314.

After the formation of the dielectric layers 316 and the redistribution layers 318, the redistribution structure 300 is formed. In some embodiments, as shown in FIG. 1F, the redistribution structure 300 is formed to include a fine-featured portion (including the optical dielectric layer 302, the redistribution layer 304, the optical dielectric layer 308, the redistribution layer 310, the dielectric layer 312 and the redistribution layer 314) and a coarse-featured portion (including the dielectric layer 316 and the redistribution layer 318) over the fine-featured portion along the direction Z. However, the disclosure is not limited thereto. In some alternative embodiments, the redistribution structure 300 may be formed to include only a fine-featured portion. It is noted that the prism structure 400A and the prism structure 400B used for transmitting the optical signals (e.g., light) are formed within the redistribution structure 300, and some of the conductive vias (e.g., conductive vias 310a) in the redistribution structure 300 function as the reflectors for reflecting light passing through the prism structure 400A and the prism structure 400B.

Following the formation of the redistribution structure 300, an insulating layer 320 is formed on the redistribution structure 300. In detail, as shown in FIG. 1F, the insulating layer 320 is formed on the topmost layer of the dielectric layers 316 and formed to laterally cover the topmost layer of the redistribution layers 318. In some embodiments, as shown in FIG. 1F, the illustrated top surface of the insulating layer 320 is substantially flush or coplanar with the illustrated top surface of the topmost layer of the redistribution layers 318. However, the disclosure is not limited thereto. In some alternative embodiments, the illustrated top surface of the insulating layer 320 may be higher than the illustrated top surface of the topmost layer of the redistribution layers 318. In some embodiments, the material of the insulating layer 320 includes PI, PBO, BCB, epoxy, silicon oxide ($SiO_x$, where x>0), silicon nitride ($SiN_x$, where x>0), or combinations thereof. In some embodiments, the material of the insulating layer 320 is the same as the material of the dielectric layers 316. In some alternative embodiments, the material of the insulating layer 320 is different from the material of the dielectric layers 316. In some embodiments, the insulating layer 320 is formed by suitable fabrication techniques such as spin-on coating, CVD, HDPCVD, PECVD, or ALD.

Figure 1G:
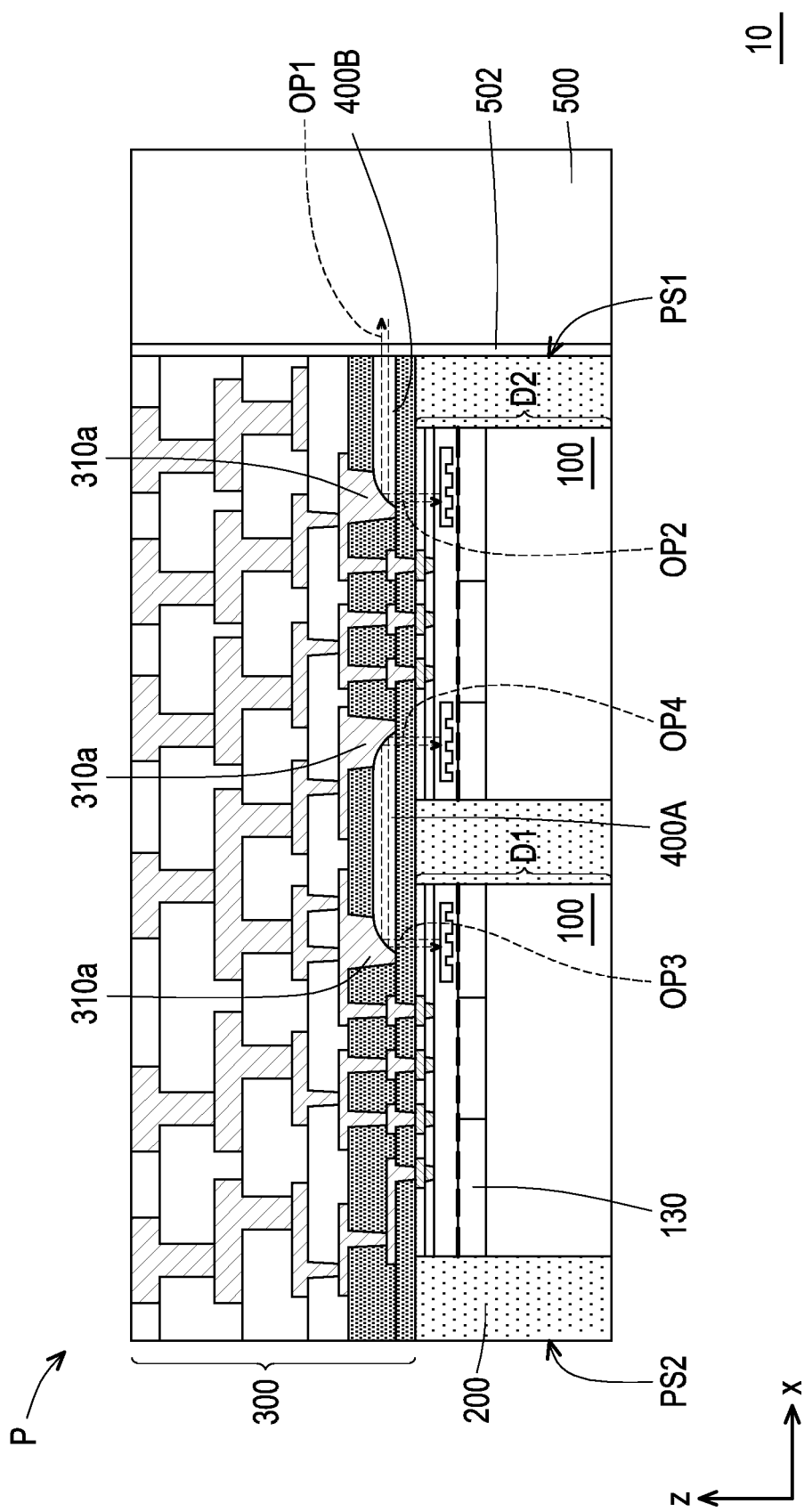

Referring to FIG. 1G, after the formation of the insulating layer 320, the first die stack structure D1, the second die stack structure D2 and the insulating encapsulation 200 are separated from the carrier CC1 such that the first die stack structure D1, the second die stack structure D2 and the insulating encapsulation 200 are exposed. In detail, as shown in FIG. 1G, the illustrated bottom surfaces of the first die stack structure D1, the second die stack structure D2 and the insulating encapsulation 200 are exposed. In some embodiments, the de-bonding layer DL is a LTHC release layer. In some embodiments, upon irradiation with an UV laser, the de-bonding layer DL and the carrier CC1 may be peeled off and removed from the overlying structure. It should be noted that the de-bonding process is not limited thereto. Other suitable methods may be used in some alternative embodiments. In some embodiments, before the carrier CC1 is removed, a frame tape (not shown) is attached to the insulating layer 320.

Continued on FIG. 1G, after the carrier CC1 is removed, a singulation process (e.g., sawing, laser cutting, etching, a combination thereof, etc.) is performed along scribe lines (not shown) to form a plurality of package components P. As mentioned, the manufacturing process described above is part of a wafer level packaging process, although one singulated package component P is shown in FIG. 1G, those skilled in the art should understand that plural package components P are obtained after the singulation process. In some embodiments, the singulation process is performed to cut through the insulating encapsulation 200, the redistribution structure 300, the prism structure 400B, and the insulating layer 320, as shown in FIG. 1F and FIG. 1G. For example, the insulating encapsulation 200, the redistribution structure 300, the prism structure 400B and the insulating layer 320 are cut through to form a first coterminous sidewall PS1 of the package component P, and the insulating encapsulation 200, the redistribution structure 300 and the insulating layer 320 are cut through to form a second coterminous sidewall PS2 of the package component P. In detail, as shown in FIG. 1G, the first coterminous sidewall PS1 includes the singulated outer sidewall of the insulating encapsulation 200, the singulated outer sidewall of the redistribution structure 300, the singulated outer sidewall of the prism structure 400B and the singulated outer sidewall of the insulating layer 320 that are substantially aligned with one another, and the second coterminous sidewall PS2 includes the other singulated outer sidewall of the insulating encapsulation 200, the other singulated outer sidewall of the redistribution structure 300 and the other singulated outer sidewall of the insulating layer 320 that are substantially aligned with one another. That is to sat, the second coterminous sidewall PS2 is free of the prism structure. In some embodiments, the frame tape (not shown) attached on the insulating layer 320 is removed after the singulation process.

Continued on FIG. 1G, after the singulated package component P is obtained, the optical signal source 500 may be disposed in proximity to the first coterminous sidewall PS1 of the package component P and aligned with the prism structure 400B. In detail, as shown in FIG. 1G, after aligning the optical signal source 500 with the prism structure 400B, an optical interface layer 502 is formed between the optical signal source 500 and the package component P. After the formation of the optical signal source 500 and the optical interface layer 502, a semiconductor package 10 is provided.

In some embodiments, the optical signal source 500 is an optical input/output (I/O) port (e.g., a single-mode, a multi-mode optical fiber, or the like) where optical signals may enter and/or exit. In some embodiments, the optical signal source 500 is aligned with the prism structure 400B and the conductive via 310a being in physical and direct contact with the prism structure 400B (i.e., the reflector of the prism structure 400B) to enable exchange of optical signals between the optical signal source 500 and the prism structure 400B, as represented by the optical paths OP1 and OP2 in FIG. 1G. As such, in semiconductor package 10, the prism structure 400B and the reflector of the prism structure 400B disposed within the redistribution structure 300 are collectively referred to as an edge coupler. Further, as shown by the optical paths OP3 and OP4 in FIG. 1G, the prism structure 400A and the conductive vias 310a being in physical and direct contact with the prism structure 400A (i.e., the reflectors of the prism structure 400A) are collectively referred to as a bridge coupler, because the prism structure 400A and the reflectors of the prism structure 400A disposed within the redistribution structure 300 are used for the intercommunication of the optical signals between the first die stack structure D1 and the second die stack structure D2.

In some embodiments, the optical axis of the optical signal source 500 may be substantially parallel to a normal direction of the first coterminous sidewall PS1 of the package component P. In some embodiments, an angle (e.g., between a few degrees to about 90 degrees) is formed between the optical axis of the optical signal source 500 and the first coterminous sidewall PS1 of the package component P. The angle between the optical axis and the first coterminous sidewall PS1 may be adjusted depending on the characteristics of the optical signal source 500 and depending on how well the optical connection is optimized. It is noted that the angle between the optical signal source 500 and the package component P construes no limitation in the disclosure.

In some embodiments, the optical interface layer 502 includes clear (or transparent) adhesive or other suitable optical glue/grease. In some embodiments, the material of the optical interface layer 220 includes an epoxy-based compound, a silicone-based compound, an acrylic-based compound, a combination thereof, or the like. In some embodiments, the optical interface layer 502 is used to provide optical transparency and mechanical fixation. In some embodiments, the optical interface layer 502 is a layer of index-matching adhesive. For example, the optical interface layer 502 is index-matched to the fibers in the optical signal source 500 and to the first coterminous sidewall PS1 of the package component P to reduce optical loss. The optical interface layer 502 may be a single-layer or multi-layer structure.

Figure 2:
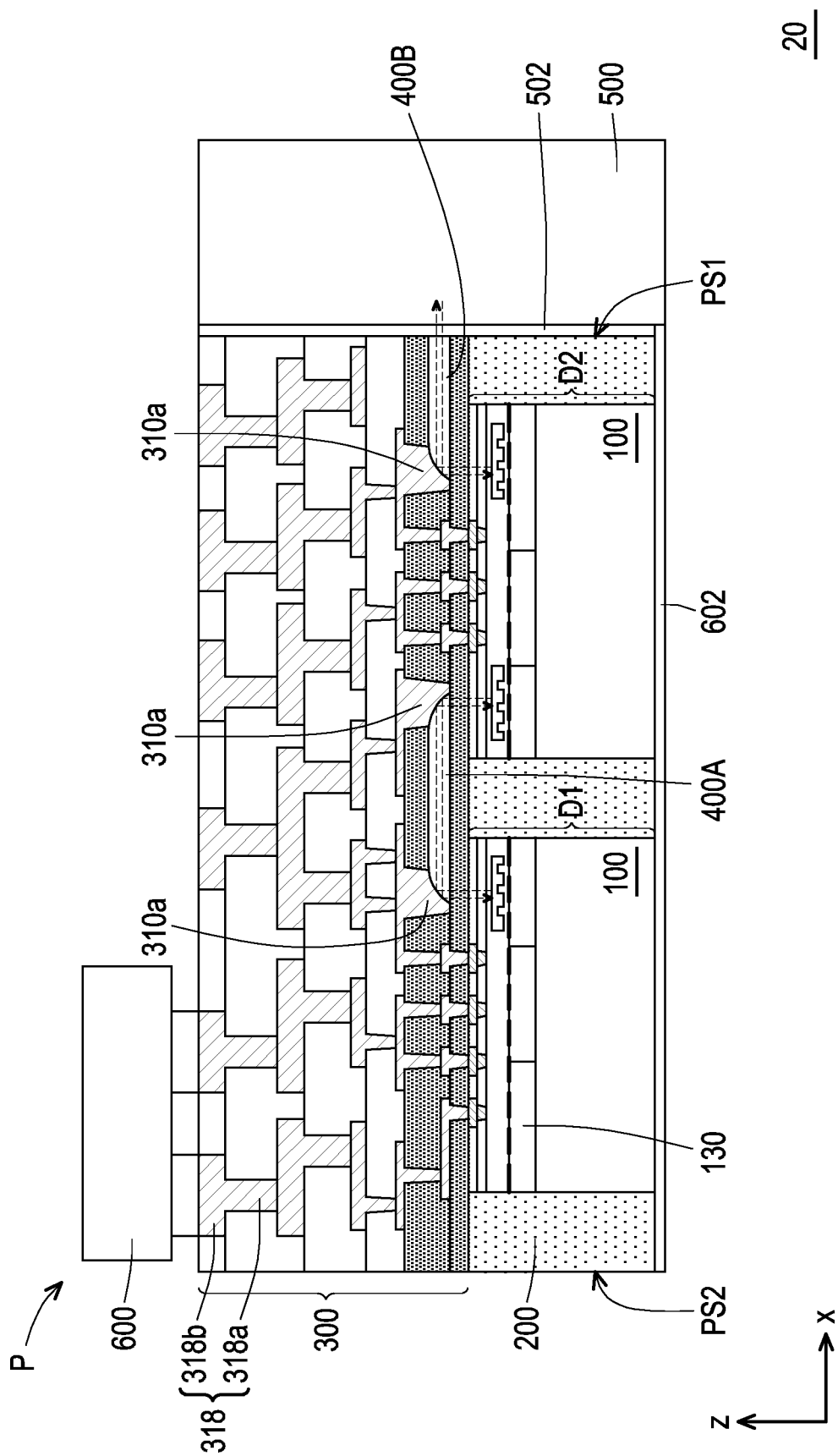
FIG. 2 is a schematic cross-sectional view of a semiconductor package in accordance with some alternative embodiments of the disclosure.

FIG. 2 is a schematic cross-sectional view of a semiconductor package in accordance with some alternative embodiments of the disclosure. The semiconductor package 20 of FIG. 2 is similar to the semiconductor package 10 of FIG. 1G, and the difference between them lies in that, the semiconductor package 20 further includes an electronic device 600 and a thermal dissipation layer 602. As shown in FIG. 2, the electronic device 600 is bonded to the redistribution structure 300. In some embodiments, the electronic device 600 is bonded to the conductive pads in the conductive wiring layer 318b of the topmost layer of the redistribution layers 318. In some embodiments, the electronic device 600 is a voltage regulator module. The number of the electronic device 600 bonded to the redistribution structure 300 is not limited in the disclosure, and may be more than what is depicted in FIG. 2, and may be designated based on demand and/or design layout.

As shown in FIG. 2, the thermal dissipation layer 602 is disposed on the first die stack structure D1, the second die stack structure D2 and the insulating encapsulation 200 and opposite to the redistribution structure 300. In detail, as shown in FIG. 2, the thermal dissipation layer 602 is disposed on and in physical and direct contact with the supporting substrate 100 of the first die stack structure D1 and the supporting substrate 100 of the second die stack structure D2. In some embodiments, the thermal dissipation layer 602 may include a thermal interface material (TIM). In some embodiments, the TIM is an adhesive material. In some embodiments, the TIM includes grease-based materials, phase change materials, gels, adhesives, polymeric, metallic materials, or a combination thereof. In some embodiments, the TIM includes lead-tin based solder (PbSn), silver paste (Ag), gold, tin, gallium, indium, or other suitable thermally conductive materials. Depending on the type of material used, the TIM may be formed by deposition, lamination, printing, plating, or any other suitable technique. In some embodiments, the TIM is a gel type material. In some embodiments, the TIM is a film type material (e.g., carbon nanotubes or graphite).

Figure 3:
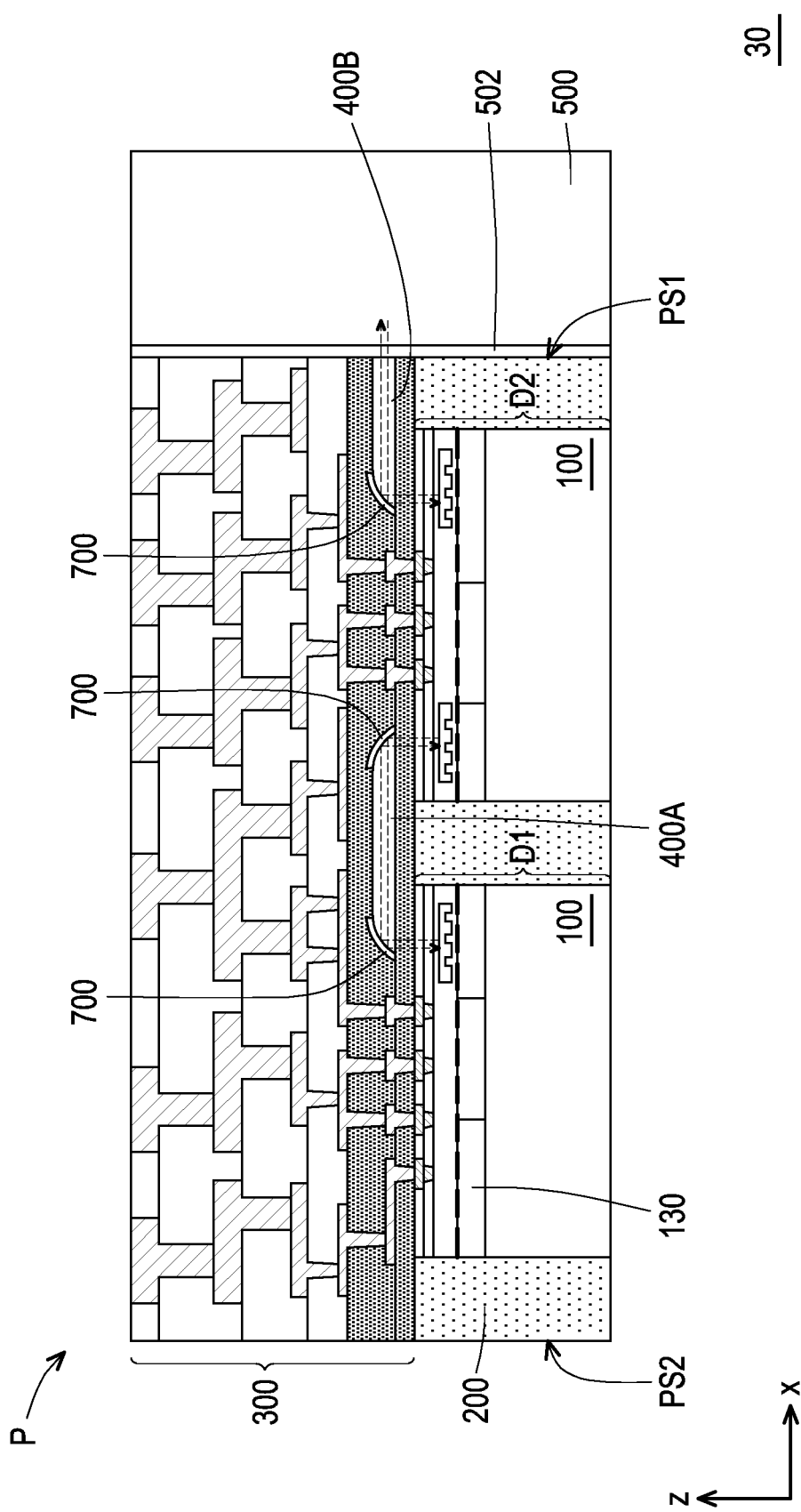
FIG. 3 is a schematic cross-sectional view of a semiconductor package in accordance with some alternative embodiments of the disclosure.

FIG. 3 is a schematic cross-sectional view of a semiconductor package in accordance with some alternative embodiments of the disclosure. The semiconductor package 30 of FIG. 3 is similar to the semiconductor package 10 of FIG. 1G, and the difference between them lies in that, the semiconductor package 30 includes a plurality of reflectors 700, and the conductive vias 310a are not in physical and direct contact with the prism structure 400A or the prism structure 400B. In detail, as shown in FIG. 3, the reflectors 700 are in physical and direct contact with the curved profile of each of the prism structure 400A and the prism structure 400B. In some embodiments, the reflectors 700 are formed before forming the optical dielectric layer 308. From another point of view, the reflectors 700 are covered by the optical dielectric layer 308. In some embodiments, the formation of the reflectors 700 may include depositing a photoresist material, which is subsequently irradiated (exposed) and developed to pattern the photoresist material so as to form the sacrificial mask with openings; and forming the reflectors 700 within the openings. In some embodiments, the formation of the reflectors 700 may include depositing a barrier/adhesion metal material (e.g., Ti or Cr) and a highly reflective metal (e.g., Cu, Al, Ag, or Au) by a sputtering process. Any other suitable material having a desired reflective property or process (e.g., PVD, plating, etc.) may also be used. Further, according to descriptions with respect to FIG. 2, it may be deduced that the semiconductor package 30 may further includes at least one electronic device (e.g., the electronic device 600 in FIG. 2) and a thermal dissipation layer (e.g., the thermal dissipation layer 602 in FIG. 2).

It is appreciated that each of the semiconductor packages 10, 20 and 30 may include various other package components that may be used for various functions, which are also contemplated in accordance with some embodiments. Each of the semiconductor packages 10, 20 and 30 may be a part of an electronic system for such as computers (e.g., high-performance computer), computational devices used in conjunction with an artificial intelligence system, wireless communication devices, computer-related peripherals, and entertainment devices, etc. The semiconductor packages 10, 20 and 30 discussed herein may provide broad bandwidth and dense optical signal I/O communication in accordance with some embodiments. It should be noted that other electronic applications are also possible.

In accordance with an embodiment, a semiconductor package includes a first die stack structure and a second die stack structure laterally spaced apart from each other along a first direction, wherein each of the first die stack structure and the second die stack structure comprises: an electronic die, and a photonic die electronically communicating with the electronic die; an insulating encapsulation laterally encapsulating the first die stack structure and the second die stack structure; a redistribution structure disposed on the first die stack structure, the second die stack structure and the insulating encapsulation, and electrically connected to the first die stack structure and the second die stack structure; at least one prism structure disposed within the redistribution structure and optically coupled to the photonic die; and at least one reflector disposed on the at least one prism structure.

In accordance with an embodiment, a semiconductor package includes a first die stack structure and a second die stack structure arranged side by side, wherein each of the first die stack structure and the second die stack structure comprises: an electronic die, and a photonic die bonded to the electronic die; an insulating encapsulation laterally encapsulating the first die stack structure and the second die stack structure; a redistribution structure disposed on the first die stack structure, the second die stack structure and the insulating encapsulation, and electrically connected to the first die stack structure and the second die stack structure; a first prism structure and a second prism structure disposed within the redistribution structure, wherein the first prism structure extends over and optically coupled to the photonic die of the first die stack structure and the photonic die of the second die stack structure, and the second prism structure extends over and optically coupled to the photonic die of the second die stack structure; first reflectors disposed on the first prism structure; a second reflector disposed on the second prism structure; and an optical signal source facing and aligned with the second prism structure.

In accordance with an embodiment, a manufacturing method of a semiconductor package includes at least the following steps. A first die stack structure and a second die stack structure are arranged side by side over a carrier, wherein each of the first die stack structure and the second die stack structure comprises: an electronic die, and a photonic die electronically communicating with the electronic die. The first die stack structure and the second die stack structure are laterally encapsulated with an insulating encapsulation. A redistribution structure is formed over the insulating encapsulation, the first die stack structure and the second die stack structure, wherein the redistribution structure is electrically connected with the first die stack structure and the second die stack structure. At least one prism structure is formed within the redistribution structure. At least one reflector is formed to be in contact with the at least one prism structure. A singulation process is performed to cut off the insulating encapsulation, the redistribution structure, the at least one prism structure to form a coterminous sidewall. An optical signal source is disposed over the coterminous sidewall to align the optical signal source to the at least one prism structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first die stack structure and a second die stack structure laterally spaced apart from each other along a first direction, wherein each of the first die stack structure and the second die stack structure comprises:
   an electronic die; and
   a photonic die electronically communicating with the electronic die;
   an insulating encapsulation laterally encapsulating the first die stack structure and the second die stack structure;
   a redistribution structure disposed on the first die stack structure, the second die stack structure and the insulating encapsulation, and electrically connected to the first die stack structure and the second die stack structure;
   at least one prism structure disposed within the redistribution structure and optically coupled to the photonic die; and
   at least one reflector disposed on the at least one prism structure.

2. The semiconductor package of claim 1, wherein the redistribution structure comprises:
   a first optical dielectric layer underlying the at least one prism structure;
   a second optical dielectric layer disposed on the first optical dielectric layer and the at least one prism structure; and
   conductive vias extending vertically through the second optical dielectric layer along the second direction.

3. The semiconductor package of claim 2, wherein the at least one prism structure comprises a first curved surface concaving toward the first die stack structure and the second die stack structure.

4. The semiconductor package of claim 3, wherein the photonic die of each of the first die stack structure and the second die stack structure comprises at least one optical component, the first curved surface of the at least one prism structure is partially overlapped with the at least one optical component of the first die stack structure along second direction perpendicular to the first direction.

5. The semiconductor package of claim 4, wherein the at least one reflector comprises a first reflector extending vertically through the second optical dielectric layer along the second direction, and the first reflector is direct contact with the first curved surface.

6. The semiconductor package of claim 5, wherein the at least one prism structure further comprises a second curved surface concaving toward the first die stack structure and the second die stack structure, and the second curved surface of the at least one prism structure is partially overlapped with the at least one optical component of the second die stack structure along the second direction.

7. The semiconductor package of claim 6, wherein the at least one reflector further comprises a second reflector extending vertically through the second optical dielectric layer along the second direction, and the second reflector is direct contact with the second curved surface.

8. The semiconductor package of claim 4, wherein the at least one reflector comprises a first reflector covered by the second optical dielectric layer, and the first reflector is direct contact with the first curved surface.

9. The semiconductor package of claim 8, wherein the at least one prism structure further comprises a second curved surface concaving toward the first die stack structure and the second die stack structure, and the second curved surface of the at least one prism structure is partially overlapped with the at least one optical component of the second die stack structure along the second direction.

10. The semiconductor package of claim 9, wherein the at least one reflector further comprises a second reflector covered by the second optical dielectric layer, and the second reflector is direct contact with the second curved surface.

11. A semiconductor package, comprising:
a first die stack structure and a second die stack structure arranged side by side, wherein each of the first die stack structure and the second die stack structure comprises:
an electronic die; and
a photonic die bonded to the electronic die;
an insulating encapsulation laterally encapsulating the first die stack structure and the second die stack structure;
a redistribution structure disposed on the first die stack structure, the second die stack structure and the insulating encapsulation, and electrically connected to the first die stack structure and the second die stack structure;
a first prism structure and a second prism structure disposed within the redistribution structure, wherein the first prism structure extends over and optically coupled to the photonic die of the first die stack structure and the photonic die of the second die stack structure, and the second prism structure extends over and optically coupled to the photonic die of the second die stack structure;
first reflectors disposed on the first prism structure;
a second reflector disposed on the second prism structure; and
an optical signal source facing and aligned with the second prism structure.

12. The semiconductor package of claim 11, wherein the redistribution structure comprises:
a first optical dielectric layer underlying the first prism structure and the second prism structure;
a second optical dielectric layer disposed on the first optical dielectric layer, the first prism structure and the second prism structure;
a first conductive wiring layer disposed on the first optical dielectric layer;
a second conductive wiring layer disposed on the second optical dielectric layer; and
conductive vias connecting between the first conductive wiring layer and the second conductive wiring layer.

13. The semiconductor package of claim 12, wherein each of the first reflectors connects between the first prism structure and the second conductive wiring layer, and the second reflector connects between the second prism structure and the second conductive wiring layer.

14. The semiconductor package of claim 13, wherein a material of each of the first reflectors and the second reflector is the same as a material of the conductive vias.

15. The semiconductor package of claim 12, wherein each of the first reflectors is in contact with the first prism structure and spaced apart from the second conductive wiring layer via the second optical dielectric layer, and the second reflector is in contact with the second prism structure and spaced apart from the second conductive wiring layer via the second optical dielectric layer.

16. The semiconductor package of claim 11, further comprising: an optical interface layer disposed between the optical signal source and the insulating encapsulation, between the optical signal source and the redistribution structure, and between the optical signal source and the second prism structure.

17. The semiconductor package of claim 11, further comprising:
an electronic device bonded to the redistribution structure; and
a thermal dissipation layer disposed on the first die stack structure, the second die stack structure and the insulating encapsulation.

18. A manufacturing method of a semiconductor package, comprising:
arranging a first die stack structure and a second die stack structure side by side over a carrier, wherein each of the first die stack structure and the second die stack structure comprises:
an electronic die; and
a photonic die electronically communicating with the electronic die;
laterally encapsulating the first die stack structure and the second die stack structure with an insulating encapsulation;
forming a redistribution structure over the insulating encapsulation, the first die stack structure and the second die stack structure, wherein the redistribution structure is electrically connected with the first die stack structure and the second die stack structure;
forming at least one prism structure within the redistribution structure;
forming at least one reflector to be in contact with the at least one prism structure;
performing a singulation process to cut off the insulating encapsulation, the redistribution structure, the at least one prism structure to form a coterminous sidewall; and
disposing an optical signal source over the coterminous sidewall to align the optical signal source to the at least one prism structure.

19. The manufacturing method of claim 18, wherein forming the redistribution structure comprises:
forming an optical dielectric layer covering the at least one prism structure; and
forming conductive vias extending vertically through the optical dielectric layer toward the carrier, wherein
the at least one reflector and the conductive vias are formed in the same process.

20. The manufacturing method of claim 18, wherein forming the redistribution structure comprises: forming an optical dielectric layer covering the at least one prism structure, wherein
the at least one reflector is formed before forming the optical dielectric layer.

* * * * *